US009688819B2

(12) United States Patent
Sandmeyer et al.

(10) Patent No.: US 9,688,819 B2
(45) Date of Patent: Jun. 27, 2017

(54) SILICONE RESIN COMPOSITION FOR OPTICAL SEMICONDUCTORS

(71) Applicant: Wacker Chemie AG, Munich (DE)

(72) Inventors: Frank Sandmeyer, Burgkirchen (DE); Enno Funk, Mehring (DE); Georg Loessel, Emmerting (DE)

(73) Assignee: WACKER CHEMIE AG, Munich (DE)

( * ) Notice: Subject to any disclaimer, the term of this patent is extended or adjusted under 35 U.S.C. 154(b) by 0 days.

(21) Appl. No.: 14/909,165

(22) PCT Filed: Jul. 30, 2014

(86) PCT No.: PCT/EP2014/066369
§ 371 (c)(1),
(2) Date: Feb. 1, 2016

(87) PCT Pub. No.: WO2015/014890
PCT Pub. Date: Feb. 5, 2015

(65) Prior Publication Data
US 2016/0194452 A1    Jul. 7, 2016

(30) Foreign Application Priority Data

Aug. 1, 2013 (DE) .................. 10 2013 215 102

(51) Int. Cl.
C08G 77/04 (2006.01)
C09D 183/04 (2006.01)
C08G 77/12 (2006.01)
C08G 77/20 (2006.01)
H01L 23/29 (2006.01)
H01L 33/56 (2010.01)
C08G 77/00 (2006.01)

(52) U.S. Cl.
CPC ........... C08G 77/04 (2013.01); C09D 183/04 (2013.01); C08G 77/12 (2013.01); C08G 77/20 (2013.01); C08G 77/70 (2013.01); C08G 77/80 (2013.01); H01L 23/296 (2013.01); H01L 33/56 (2013.01); H01L 2924/0002 (2013.01)

(58) Field of Classification Search
CPC ......... C08G 77/12; C08G 77/20; C08G 77/80
See application file for complete search history.

(56) References Cited

U.S. PATENT DOCUMENTS

| 3,775,452 | A | 11/1973 | Karstedt |
| 8,071,707 | B2 | 12/2011 | Kashiwagi |
| 8,748,553 | B2 | 6/2014 | Bortenschlager et al. |
| 2004/0092660 | A1 | 5/2004 | Koehler et al. |
| 2005/0137328 | A1 | 6/2005 | Staiger et al. |
| 2006/0081864 | A1 | 4/2006 | Nakazawa |
| 2006/0167202 | A1 | 7/2006 | Schattenmann et al. |
| 2006/0167297 | A1 | 7/2006 | Schattenmann et al. |
| 2007/0078277 | A1 | 4/2007 | Ackermann |
| 2008/0255334 | A1 | 10/2008 | Ackermann |
| 2009/0259002 | A1* | 10/2009 | Kashiwagi ............ C08G 77/20 525/475 |
| 2010/0210794 | A1 | 8/2010 | Frese et al. |
| 2012/0123051 | A1 | 5/2012 | Kuwata |
| 2012/0202960 | A1 | 8/2012 | Staiger |
| 2012/0256325 | A1 | 10/2012 | Kashiwagi et al. |

FOREIGN PATENT DOCUMENTS

| CN | 101802100 A | 8/2010 |
| CN | 102471579 A | 5/2012 |
| CN | 103068926 A | 4/2013 |
| DE | 102 42 418 A1 | 3/2004 |
| DE | 103 59 705 A1 | 7/2005 |
| DE | 10 2005 003 898 A1 | 8/2006 |
| DE | 10 2005 003 899 A1 | 8/2006 |
| DE | 10 2005 047 394 A1 | 4/2007 |
| DE | 10 2005 047 395 A1 | 4/2007 |
| DE | 10 2009 045 930 A1 | 4/2011 |
| EP | 2 399 961 B1 | 12/2012 |
| JP | 2009275214 A | 11/2009 |
| WO | 2004107458 A2 | 12/2004 |
| WO | 2006013066 A2 | 2/2006 |
| WO | 2011012550 A2 | 2/2011 |

* cited by examiner

Primary Examiner — Kuo-Liang Peng
(74) Attorney, Agent, or Firm — Brooks Kushman P.C.

(57) ABSTRACT

Addition-crosslinkable silicone resin compositions containing a branched organopolysiloxane bearing each of Si—H groups, alkenyl groups, and aryl groups, and also containing blocks of linear organopolysiloxane free of Si—H and alkenyl groups with a chain length of at least three siloxy groups, and further bearing at least one aryl group, serve as excellent potting compositions for electronic devices, particularly LEDs, with high refractive index and optical transmittance, and wide processing latitude.

10 Claims, No Drawings

SILICONE RESIN COMPOSITION FOR OPTICAL SEMICONDUCTORS

CROSS REFERENCE TO RELATED APPLICATIONS

This application is the U.S. National Phase of PCT Appln. No. PCT/EP2014/066369 filed Jul. 30, 2014, which claims priority to German Application No. 10 2013 215 102.0 filed Aug. 1, 2013, the disclosures of which are incorporated in their entirety by reference herein.

BACKGROUND OF THE INVENTION

1. Field of the Invention

The invention relates to silicone resin compositions and use of these for the production of optical semiconductor elements.

2. Description of the Related Art

The requirements placed upon potting compositions for the production of electrical and electronic components, in particular for the production of optical semiconductor elements such as high-power LEDs (light emitting devices) are very extensive and to some extent contradictory, the aim being to ensure high light yield and lifetime from the LED. Examples of desired properties are:

good surface hardness and shaping properties;
together with flexibility;
good lightfastness and good thermal stability;
good weathering resistance;
low gas transmission and thus avoidance of corrosion;
high transparency;
high refractive index;
no yellowing (discoloration due to heat);
good processing properties;
easy and therefore cost-efficient compositions and, resulting therefrom, greater cost-efficiency in LED production methods.

The prior art hitherto has already disclosed many proposed solutions, but none of these has ever been capable of satisfying every detail of these requirements.

Many documents disclose the use of addition-crosslinking silicone compositions for the production of LEDs. They are composed of at least one organopolysiloxane having at least two aliphatically unsaturated groups in the molecule, and also of at least one organohydropolysiloxane having two or more Si—H groups in the molecule, and of at least one hydrosilylation catalyst, and frequently of other additives.

The following documents cited by way of example are concerned with proposed solutions for reducing gas transmission. EP2399961B1, for example, discloses addition-crosslinking silicone resin compositions of this type for LED production where at least one antioxidant has to be present as a further additive. US20120256325A1 discloses silicone resin compositions comprising an aryl silicone resin having at least 2 vinyl groups, an addition catalyst, and also an organohydropolysiloxane mixture composed of two different organohydropolysiloxanes having Si-aryl units within the chain, the first being an organohydropolysiloxane oil having alpha-omega terminal Si—H groups, and the second being a monofunctional organopolyhydrosiloxane oil having only one terminal Si—H group. Disadvantages of both solutions are their relatively complex composition, preparative accessibility that is sometimes problematic, and associated therewith, reduced cost-effectiveness.

WO2004/107458A2 discloses addition-crosslinking organopolysiloxane preparations which can optionally be self-crosslinking, either comprising self-crosslinking organopolysiloxanes which require resin units which comprise, per molecule, not only aliphatically unsaturated groups but also Si—H groups, or comprising an addition-crosslinkable preparation made of organopolysiloxanes which also comprise resin units, and also comprising a hydrosilylation catalyst. DE10359705A1 also discloses addition-crosslinking silicone preparations which also contain a self-crosslinking silicone resin. The disadvantage of the preparations described in these documents is that they are composed exclusively of oligomeric or polymeric polyorganosiloxanes, which makes it much more difficult to establish particular processing properties, especially viscosity, which can vary widely, depending on the desired processing method. The resultant disadvantageous effect is that preparations of this type have to be optimized specifically in each case for a particular processing method, and therefore when new organopolysiloxanes are used for a specific purpose these always require appropriate changes to the processing methods, or vice versa.

There is therefore a need for silicone compositions which can easily be varied, and at the same time comply with the requirements indicated above.

SUMMARY OF THE INVENTION

It was therefore an object of the present invention to provide a silicone composition of maximum simplicity which nevertheless complies with the abovementioned requirement placed upon potting compositions for LEDs. These and other objects have been achieved via the addition-crosslinking silicone resin composition of the invention, which comprises: A) a specially branched self-crosslinking organopolysiloxane, B) optionally, a processing adjusting Si—H functional coupling agent, and C) a hydrosilylation catalyst.

DESCRIPTION OF THE PREFERRED EMBODIMENTS

The inventive compositions thus comprises:
A) at least one branched, self-crosslinking organopolysiloxane of the general formula (I)

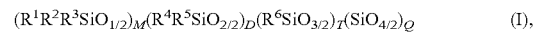

$$(R^1R^2R^3SiO_{1/2})_M(R^4R^5SiO_{2/2})_D(R^6SiO_{3/2})_T(SiO_{4/2})_Q \quad (I),$$

where
$R^1$ to $R^6$ are mutually independently monovalent, optionally substituted hydrocarbon moieties which can be interrupted by heteroatoms, or are an OH group, or a hydrogen atom,
M, D, T, and Q are numbers from 0 to <1,
with the proviso that M+D+T+Q=1 and Q+T>0, and
with the proviso that a molecule A) comprises, as moieties $R^1$ to $R^6$,
at least two alkenyl groups,
at least two hydrogen atoms, and
at least one aryl group,
and with the proviso that at least 5 mol % of all of the subunits of A) take the form $(R^4R_5SiO_{2/2})_D$, with the proviso that at least 6 mol % of all of the subunits $(R^4R^5SiO_{2/2})_D$ are present as chain segments made of from 3 to 200 adjacent subunits in A), and the moieties $R^4$ and $R^5$ of said subunits present as chain segments are neither a hydrogen atom nor an alkenyl moiety, where the molar ratio of the silicon-bonded repeating units bearing alkenyl groups to the repeating units bearing silicon-bonded hydrogen atoms is at least 0.75; and where the molar proportion of the silicon atoms bearing at least one aryl moiety to the total number of the silicon atoms is at least 30%; and where the molar proportion of the alkyl groups, based on the total number of the silicon-bonded moieties is at most 70%, and C) a sufficient quantity of at least one catalyst that promotes the addition reaction of Si-bonded hydrogen onto aliphatic double bonds, where the molar ratio of silicon-bonded alkenyl groups to silicon-bonded hydrogen atoms in the addition-crosslinking silicone resin composition is from 0.5:1 to 2:1.

The ratio of Si-alkenyl to Si—H in the addition-crosslinking silicone resin composition of the invention is preferably from 0.5:1 to 2:1; more preferably from 0.6:1 to 1.8:1, and most preferably from 0.6:1 to 1.6:1, in particular from 0.7:1 to 1.5:1.

The molecular weight Mw of organopolysiloxanes A) is preferably at least 1000, with greater preference at least 1300, with particular preference at least 1800, and in particular at least 2000, the polydispersity being at most 15, with preference at most 12, with particular preference at most 9, and in particular at most 6.

Viscosities of organopolysiloxanes A) are at least 1500 mPas, preferably at least 2000 mPas, and more preferably at least 2500 mPas. In another preferred embodiment, A) has a high viscosity, with a viscosity of at least 8000 mPas, preferably at least 10,000 mPas, and in particular at least 12 000 mPas. In a form that is likewise preferred, A) involves compositions that at room temperature of 23° C. are no longer flowable and have firm consistency, with a surface which remains tacky, or involves adhesion-free solids with glass transition temperature above 25° C. All data relating to viscosity are at 25° C. and at atmospheric pressure of 1013 mbar.

Organic groups $R^1$ to $R^6$ can be linear or branched alkyl moieties, preferably having from 1 to 10 carbon atoms, or alkenyl moieties preferably having from 2 to 8 carbon atoms, or aryl moieties preferably having from 6 to 8 carbon atoms. The abovementioned moieties can in each case also comprise heteroatoms. The heteroatoms can, by way of example, be oxygen, nitrogen, silicon, phosphorus, or halogen such as F, Cl, Br.

Selected examples of alkyl moieties as moieties $R^1$ to $R^6$ are the methyl, ethyl, n-propyl, isopropyl, n-butyl, isobutyl, tert-butyl, n-pentyl, isopentyl, neopentyl, and tert-pentyl moieties, hexyl moieties such as the n-hexyl moiety, heptyl moieties such as the n-heptyl moiety, octyl moieties such as the n-octyl moiety, and isooctyl moieties such as the 2,2,4-trimethylpentyl moiety, nonyl moieties such as the n-nonyl moiety, decyl moieties such as the n-decyl moiety, dodecyl moieties such as the n-dodecyl moiety, and octadecyl moieties such as the n-octadecyl moiety, and cycloalkyl moieties such as cyclopentyl, cyclohexyl, cycloheptyl, and methylcyclohexyl moieties. The methyl moiety and ethyl moiety here are the preferred alkyl moieties.

Selected examples of alkenyl moieties as moieties $R^1$ to $R^6$ are the vinyl moiety, which can optionally substituted, the allyl moiety, the butenyl moiety, the pentenyl moiety, the hexenyl moiety, the heptenyl moiety, the octenyl moiety, and the cyclohexenyl moiety. The vinyl moiety is the preferred alkenyl moiety.

Selected examples of aryl moieties as moieties $R^1$ to $R^6$ are the phenyl moiety, tolyl moieties, xylyl moieties, and ethylphenyl moieties, and aralkyl moieties, such as the benzyl moiety and the β-phenylethyl moiety.

The molar ratio of the silicon-bonded repeating units bearing alkenyl groups to the repeating units bearing silicon-bonded hydrogen atoms in A) is at least 0.75, preferably 0.8, and most preferably 0.9.

The molar proportion of the silicon atoms bearing at least one aryl moiety, based on the total number of the silicon atoms in A), is at least 30%, preferably at least 40%, and most preferably at least 50%.

The molar proportion of the alkyl groups, based on the total number of the silicon-bonded moieties in A), is at most 70%, preferably at most 65%, and more preferably at most 60%, and in particular at most 55%.

The molar proportion of the OH groups, based on the total number of the silicon-bonded moieties, is at most 3% in A), preferably at most 2.5%, more preferably at most 2.0%, and in particular at most 1.5%.

The molar proportion of hydrogen groups, based on the total number of the silicon-bonded moieties, is from 0.1 to 45% in A), preferably from 1 to 42%, more preferably from 2 to 39%, and in particular from 2.5 to 36%. The determination method is $^{29}Si$ NMR spectroscopy.

The molar proportion of vinyl groups is from 2 to 45%, preferably from 4 to 42%, more preferably from 6 to 39%, and in particular from 8 to 36%. The determination method is $^{29}Si$ NMR spectroscopy.

The quantity of the subunits $(R^1R^2R^3SiO_{1/2})_M$ in accordance with the general formula (I) present in A) is at most 55 mol %, preferably at most 50 mol %, more preferably at most 45 mol %, in particular at most 40 mol %. It is preferable that the moieties $R^1$, $R^2$, $R^3$ are not an aryl group. It is particularly preferable that the moieties $R^1R^2R^3$ are H, short-chain alkyl, such as methyl, short-chain alkenyl, such as vinyl, and also methoxy. Particular preference is given to the following embodiments of the invention: $(CH_3)_3SiO_{1/2}$, $(CH_3)_2(CH_2=CH)SiO_{1/2}$, $(CH_3)_2(H)SiO_{1/2}$.

At least 5 mol % of the subunits of A) take the form $(R^4R^5SiO_{2/2})_D$, preferably at least 8 mol %, more preferably at least 10 mol %, and in particular at least 12 mol %, but at most 65 mol %, preferably at most 60 mol %, more preferably at most 55 mol %, and in particular at most 50 mol %. The subunits $(R^4R^5SiO_{2/2})_D$ in A) serve in particular to establish an ideal balance between hardness and flexibility after crosslinking.

In order to achieve this, at least 6 mol % of all of the subunits $(R^4R^5SiO_{2/2})_D$ bear no moieties $R^4$ and $R^5$, which are a hydrogen atom or an alkenyl moiety, and at the same time they are present as chain segments of from 3 to 200 adjacent subunits in A). It is thus necessary that a minimum proportion of subunits in the molecule A) is free from active groups, in order to prevent participation in the hydrosilylation reaction during hardening to give the molding. The minimum proportion of all subunits $(R^4R^5SiO_{2/2})_D$ which have no moieties $R^4$ and $R^5$ that are a hydrogen atom or an alkenyl moiety, and which at the same time are present as chain segments, is preferably at least 9 mol %, particularly preferably at least 12 mol %, more preferably at least 15 mol %, but at most 65 mol %, preferably at most 60 mol %, more preferably at most 55 mol %, and in particular at most 50 mol %. These chain segments are preferably from 3 to 150, in particular from 3 to 100, adjacent subunits.

This means that they are adjacent and thus are present in an uninterrupted sequence.

Preferred moieties $R^4$ and $R^5$ are alkyl and aryl moieties. Particular preference is given to methyl and phenyl. Particularly preferred as embodiments of the invention are: $(CH_3)_2SiO_{2/2}$ and $(CH_3)(C_6H_5)SiO_{2/2}$.

If a high refractive index or particularly high thermal stability are desired, at least 50 mol %, preferably at least 55 mol %, more preferably at least 60 mol %, and in particular at least 65 mol %, of the chain segments should bear at least one aryl moiety. In one particularly preferred embodiment, at least 50 mol %, preferably at least 55 mol %, more preferably at least 60 mol %, and in particular at least 65 mol %, of the chain segments simultaneously bear an alkyl moiety and an aryl moiety.

These chain segments are of major importance for the present invention because they lead to intramolecular flexibilization of the resin structure of A) in such a way that the flexibility of hardened moldings is at least as good as that of moldings made of more complex compositions which must contain additional, flexibilizing additives in order to achieve the same properties.

These chain segments are thus introduced only for the purpose of the control of mechanical properties of moldings obtainable from branched polyorganosiloxanes of the invention, and are free from addition-crosslinkable functions. This is the only way of ensuring that these chain segments are retained unaltered after crosslinking. If they were to participate in the crosslinking reaction, that would increase the degree of branching, and their flexibilizing effect would be lost to some extent or even entirely. It is therefore important that the nature of the flexibilizing units is always such that they comprise no groups that participate in the subsequent addition-crosslinking reaction, i.e. in particular silicon-bonded alkenyl moieties or silicon-bonded hydrogen moieties. It is surprising that a length of the chain segments made of at least 3 subunits is already sufficient to achieve noticeable intramolecular flexibilization, when there is a certain minimum amount of chain segments of this type bonded within the entire molecular structure.

The quantity of the subunits $(R^6SiO_{3/2})_T$ in accordance with the general formula (I) present in A) is at least 10 mol %, more preferably at least 20 mol %, and in particular at least 25 mol %. It is preferable that $R^6$ is an aryl group and not a hydrogen atom, and not an alkenyl group. Particular preference is given to the phenyl moiety as an aryl group $R^6$. It is preferable that in A) there is at least 1 of this subunit present, having an aryl moiety as $R^6$, preferably a phenyl moiety.

The quantity of the subunits $(SiO_{4/2})_Q$ in accordance with the general formula (I) present in A) is at most 20 mol %, more preferably at most 15 mol %, and in particular it is preferable that no subunits of this type are present in A).

The entirety of all 4 abovementioned subunits totals 100 mol %.

The prior art discloses various processes which can be used to produce A) from commercially available starting materials such as alkoxysilanes, chlorosilanes, and combinations of these, and moreover with use of short-chain organosiloxanes. These processes comprise a selection and suitable combination of the reactions: hydrolysis, condensation, and equilibration. Possible production processes are batch mixer processes, continuous mixer cascade processes, quasi-continuous processes which combine continuous with batch steps in series, and continuous processes such as those in loop reactors or column reactors, where the design of these can involve connection of a plurality of systems in series, optionally in the form of double loop or double column processes. Combinations of a loop reactor and of a column reactor are equally conceivable.

One production process reacts alkoxysilanes, optionally in a mixture with short-chain organosiloxanes, in a first reaction step by way of acidic hydrolysis, and then carries out condensation optionally in stages or continuously. The reaction mixture is neutralized either via neutralization of the acid or via washing with deionized water until neutrality is achieved, and a suitable combination of the steps of distillation and filtration is then used to achieve isolation to the required purity.

Other suitable production processes are disclosed by way of example in the following documents: DE102005003899A1, DE102005047394, DE102005047395A1, DE102009045930A1, DE10242418A1, and DE102005003898A1.

Component B) can be used additionally if further adjustment of processing properties is necessary. Component B) is an Si—H coupling agent which comprises at least 2 Si—H bonds per molecule and is selected from the following groups:

a) organohydrosilanes of the general formula (II)

$$R^7{}_g(H)_hSi—R^8—Si(H)_iR^9{}_j \quad (II)$$

where
$R^7$ and $R^9$ are mutually independently monovalent, optionally substituted hydrocarbon moieties which can be interrupted by heteroatoms, where $R^7$ and $R^9$ are not an alkenyl group, are not an OH group, and are not a hydrogen atom,
H is a hydrogen atom,
$R^8$ is a $C_1$ to $C_{36}$ hydrocarbylene group which can be interrupted by heteroatoms, and moieties $R^8$ of this type always have bonding by a carbon-silicon bond to the silicon atoms, or an oxygen atom,
g and j can have the values 0, 1, 2, and 3,
h and i can have the value 1, 2, and 3,
and there is always compliance with the following conditions: g+h=3 and i+j=3, b) organohydrosiloxanes of the formula (III)

$$[R^{10}{}_k(H)_lSiO_{1/2}]_4Si \quad (III)$$

where
$R^{10}$ are mutually independently, monovalent, optionally substituted hydrocarbon moieties which can be interrupted by heteroatoms, where $R^{10}$ is not an alkenyl group, is not an OH group, and is not a hydrogen atom,
H is a hydrogen atom,
k and l can have the values 0, 1, 2, and 3,
and there is compliance with the following condition: k+l=3, c) polyorganohydrosiloxanes made of repeating units of the formula (V)

$$H_dR^7{}_eSi(OR^9)_fO_{(4-d-e-f)/2} \quad (V),$$

where
H is a hydrogen atom,
$R^7$ and $R^9$ are as defined above, and
f is 0 and 1, where f is 1 in at most 10% of the units of the formula (V) and otherwise has the value 0,
d+e is always >0, and in at least 2 units of the formula (V) has the value 3, where in said two units it is preferable that d=1 and e=2, and in all of the other units it is preferable that d=0 and e=2.
c) is composed of at least 3 repeating units of the formula (V).

At least 10 mol %, preferably at least 20 mol %, more preferably at least 25 mol %, and in particular at least 30 mol %, of c) comprise a silicon-bonded hydrogen atom.

Linear polyorganohydrosiloxanes c) have at least two repeating units of the formula (V) which bear a hydrogen atom and at the same time an alkyl or aryl moiety, and at least one, and preferably all other repeating units bear alkyl and/or aryl moieties.

A quantity of Si—H coupling agent B) used for every 100 parts of A) is at most 20 parts, preferably at most 17 parts, more preferably at most 14 parts, and in particular at most 10 parts.

Moieties $R^7$, $R^9$, $R^{10}$ of the Si—H coupling agent B) are linear or branched alkyl moieties preferably having from 1 to 10 carbon atoms, and can in each case also comprise heteroatoms. The heteroatoms can, by way of example, be oxygen, nitrogen, silicon, phosphorus, or a halogen such as F, Cl, or Br. Examples of alkyl moieties as $R^7$, $R^9$, $R^{10}$ correspond to those mentioned under $R^1$ to $R^6$. The most preferred moiety for the moieties $R^7$, $R^9$, and $R^{10}$ is the methyl moiety.

The moieties $R^8$ are substituted or unsubstituted hydrocarbylene moieties, i.e. divalent hydrocarbon moieties optionally comprising heteroatoms.

Examples of preferred alkylene and arylene moieties, moieties $R^8$ are the methylene moiety —$CH_2$—, the ethylene moiety —$CH_2$—$CH_2$—, the propylene moiety —$(CH_2)_3$—, the butylene moiety —$(CH_2)_4$—, the pentylene moiety —$(CH_2)_5$—, the hexylene moiety —$(CH_2)_6$—, the octylene moiety —$(CH_2)_8$—, and also the associated isomeric alkylene moieties, cycloalkylene moieties such as the cyclohexylene moiety and substituted cyclohexylene moieties, arylene moieties such as the ortho-, meta-, or para-phenylene moiety —$(C_6H_4)$—, where the para-phenylene moiety is particularly preferred, and arylene moieties of the following type:

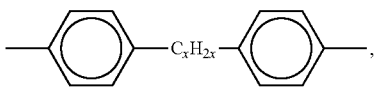

where x is an integer of value from 0 to 8.

The moiety $R^8$ can moreover be an oxygen atom.

Particular preference is given to the para-phenylene moiety for $R^8$.

Typical examples of Si—H coupling agents (B) in accordance with formula (III) are the following organosiloxanes:

$[(CH_3)_2(H)SiO_{1/2}]_4Si$
$[(CH_3CH_2)_2(H)SiO_{1/2}]_4Si$
$[(CH_3)_2(H)SiO_{1/2}]_2[(CH_3)_3SiO_{1/2}]_2Si$
$[(CH_3CH_2)_2(H) SiO_{1/2}]_2[(CH_3)_3SiO_{1/2}]_2Si$
$[(CH_3)_2(H)SiO_{1/2}]_2[(CH_3)(CH_3CH_2)_2SiO_{1/2}]_2Si$.

The Si—H coupling agents B) in accordance with formula (III) act like a point-crosslinking agent and provide more hardness to the hardened molecular structure than the Si—H coupling agents B) in accordance with formula (II), particularly when they comprise 4 silicon-bonded hydrogen atoms. In particular, Si—H coupling agents B) in accordance with formula (III) having the very high Si—H-functional density of 4 Si—H groups per organosiloxane molecule have very good suitability for crosslinking high-molecular-weight A) having a small number of vinyl groups to give hard moldings. For this reason, the Si—H coupling agents B) in accordance with formula (III) are particularly preferred for applications of that type.

Suitable catalysts C) that can be used are any of the compounds which promote the addition reaction of silicon-bonded hydrogen onto aliphatic double bonds. Preference is given here to a metal from the group of the platinum metals or a compound or a complex from the group of platinum metals. Examples of catalysts of this type are metallic and finely-divided platinum, which can be present on supports, for example on silicon dioxide, on aluminum dioxide, or on activated charcoal, compounds or complexes of platinum, for example platinum halides, e.g. $PtCl_4$, $H_2PtCl_6.6H_2O$, $Na_2PtCl_4.4H_2O$, platinum olefin complexes, platinum alcohol complexes, platinum alcoholate complexes, platinum ether complexes, platinum aldehyde complexes, platinum ketone complexes, inclusive of reaction products of $H_2PtCl_6.6H_2O$ and cyclohexanone, platinum vinyl siloxane complexes, such as platinum 1,3-divinyl-1,1,3,3-tetramethyldisiloxane complexes with or without content of detectable inorganically bonded halogen, bis(gamma-picoline) platinum dichloride, trimethylenedipyridineplatinum dichloride, dicyclopentadieneplatinum dichloride, dimethyl sulfoxide ethyleneplatinum(II) dichloride, cyclooctadiene-platinum dichloride, norbornadieneplatinum dichloride, gamma-picolineplatinum dichloride, cyclopentadieneplatinum dichloride, and also reaction products of platinum tetrachloride with olefin and with primary amine or with secondary amine or with primary and secondary amine, for example the reaction product of platinum tetrachloride dissolved in 1-octene with sec-butylamine, or ammonium platinum complex. The quantities of the catalyst used in the preparations of the invention are preferably from 5 to 2000 ppm by weight (parts by weight per million parts by weight), preferably from 10 to 1000 ppm by weight, in particular from 15 to 500 ppm by weight, calculated in each case as elemental platinum, and based on the total weight of the polyorganosiloxanes A), B), and of the organosiloxanes and/or organosilanes C).

It is preferable to use, as a catalyst, the Karstedt catalyst that has been known for a long time from the literature (U.S. Pat. No. 3,775,452), the active species of which in accordance with the Comprehensive Handbook of Hydrosilylation, published by Bogdan Marciniec, Pergamon Press 1992 is $Pt_2\{[(CH_2=CH)(CH_3)_2Si]_2O\}_3$.

The addition-crosslinking silicone resin composition of the invention can comprise, as further optional constituent, at least one flexipolymer D) of the general formula (IV)

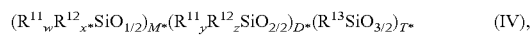

where
$R^{11}$ and $R^{12}$ and $R^{13}$ are mutually independently optionally substituted hydrocarbon moieties which can be interrupted by heteroatoms, and are not a hydrogen atom;
w and $x^*$ are respectively a number 0, 1, 2, or 3, where $w+x^*=3$;
y and z are respectively a number 0, 1, 2, or 3, where $y+z=2$;
$M^*$, $D^*$, and $T^*$ are a number from 0 to <1, where $M^*+D^*+T^*=1$,
with the proviso that, per molecule D),
there are at least two alkenyl groups present as $R^{11}$, and there is at least one aryl group present as $R^{12}$ or $R^{13}$.

Flexipolymer D) can serve for further adjustment of the mechanical properties of the hardened molding. For D), preference is given to minimal crosslinking, and $T^*$ is therefore to be minimized. Particular preference is given to linear polyorganosiloxanes, and it is therefore preferable that T*=0.

Examples of moieties $R^{11}$, $R^{12}$, and $R^{13}$ are the same as those already mentioned for $R^1$, except that they cannot be a hydrogen atom.

$R^{11}$ is preferably an alkenyl moiety, more preferably a vinyl moiety. Moieties $R^{11}$ in D) can be either terminal or within a chain, but it is preferable here that the moieties $R^{11}$ are terminal, and it is particularly preferable that only terminal moieties $R^{11}$ are present in D). In one particularly preferred embodiment of the invention, D) has two terminal moieties $R^{11}$, where each one of the two moieties $R^{11}$ is bonded to a terminal silicon atom.

Preferred moieties $R^{12}$ are alkyl moieties and aryl moieties. It is preferable that the moieties $R^{12}$ are methyl, ethyl, or phenyl moieties, in particular methyl moieties and phenyl moieties. It is particularly preferable that of two moieties $R^{12}$ present on the same silicon atom only at most one is a phenyl moiety, the other being an alkyl moiety, preferably a methyl moiety. Two moieties $R^{12}$ bonded to the same silicon atom can be two identical or different alkyl moieties, and it is particularly preferable that when two alkyl moieties are present, these are methyl moieties.

It is preferable that the moieties $R^{13}$ are alkyl moieties or aryl moieties, particular preference being given to aryl moieties, in particular the phenyl moiety.

D) is composed of at least 3 repeating Si units, preferably at least 5 repeating Si units, more preferably at least 8, and in particular at least 10 repeating Si units in accordance with the general formula (IV).

Examples of suitable flexipolymers D) in accordance with the general formula (IV) are given below, but the list here is to be interpreted only as providing examples of the invention, and not as restrictive:

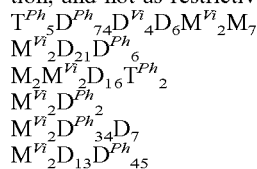
$T^{Ph}{}_5 D^{Ph}{}_{74} D^{Vi}{}_4 D_6 M^{Vi}{}_2 M_7$
$M^{Vi}{}_2 D_{21} D^{Ph}{}_6$
$M_2 M^{Vi}{}_2 D_{16} T^{Ph}{}_2$
$M^{Vi}{}_2 D^{Ph}{}_2$
$M^{Vi}{}_2 D^{Ph}{}_{34} D_7$
$M^{Vi}{}_2 D_{13} D^{Ph}{}_{45}$ The definitions relevant to the preceding examples are
$T^{Ph}=(C_6H_5)SiO_{3/2}$
$D=(CH_3)_2 SiO_{2/2}$
$D^{Ph}=(CH_3)(C_6H_5)SiO_{2/2}$
$D^{Vi}=(CH_3)(CH_2{=}CH)SiO_{2/2}$
$M=(CH_3)_3 SiO_{1/2}$
$M^{Vi}=(CH_3)_2(CH_2{=}CH)SiO_{1/2}$.

The indices indicate the frequency of presence of the respective unit in the polyorganosiloxane.

The linear flexipolymers D) serve for flexibilization in the silicone resin composition of the invention. Because they have alkenyl groups $R^{11}$, they react with Si—H groups of the organopolysiloxanes A) and of the Si—H coupling agent B). Hard resin molecules are thus bridged by flexibilizing chain segments. D) can be used in the silicone resin composition of the invention not only for flexibilization but also for viscosity adjustment, where this can lead either to an increase or else to a reduction of viscosity. Furthermore, for a catalyzed preparation it can be advantageous to formulate a two-component system in which one component comprises the catalyst, the aim here being to suppress any undesirably premature start of the curing reaction, e.g. during storage. The use of D) becomes superfluous when both flexibility and viscosity are as desired. If D) is present, the quantities used, based on 100 parts of A), are from 5 to 200 parts of D), preferably from 5 to 150 parts, more preferably from 5 to 100 parts, and in particular from 10 to 80 parts.

The addition-crosslinking silicone resin composition of the invention can comprise other constituents E) known to the person skilled in the art. Typical representative constituents are inhibitors, reinforcing and non-reinforcing fillers, plasticizers, adhesion promoters, soluble dyes, inorganic and organic pigments, fluorescent dyes, solvents, fungicides, fragrances, dispersing agents, rheological additives, corrosion inhibitors, light stabilizers, heat stabilizers, flame retardants, agents for influencing electrical properties, and agents for improving thermal conductivity.

The invention further provides a process for the production of the addition-crosslinking silicone resin compositions of the invention via mixing of all of the components A) and C) and, if desired, of other optional constituents B) or/and D) or/and E).

The invention further provides the use of the silicone resin compositions of the invention as casting compositions for the production of moldings or encapsulation systems in electrical and electronic applications, for example LEDs. Once the material has been charged to the desired molds, it is then hardened at elevated temperature. The crosslinking of the silicone resin compositions of the invention preferably takes place at from 70 to 250° C., with greater preference at from 100 to 200° C. Energy sources used for the crosslinking via heating are preferably ovens, e.g. convection drying ovens, heated tunnels, heated rolls, heated plates, or radiant heaters using infrared region.

The crosslinking times are preferably from 0.5 to 10 hours, with preference from 1 to 6 hours.

Moldings produced in this way are, to the extent that no other additional substances have been admixed, glass-clear, and their refractive index is at least 1.40, preferably at least 1.60.

The Shore D hardness of the resultant moldings, after complete hardening, without further additional substances, e.g. fillers or plasticizers, is at least 5, preferably in the range from 5 to 65, and in particular in the range of from 8 to 60.

The Shore D hardness is determined in accordance with DIN (Deutsche Industrie Norm [German Industrial Standard]) 53505 (or ASTM D2240 or ISO 868). This standard also compares the Shore D scale of hardness with Shore A. These high hardness values are an essential criterion of the invention, because the moldings are not susceptible to scratching on exposure to mechanical load, and they therefore also reduce soiling, thus ensuring high light yield over a long period. The moldings are thermally stable and UV-resistant, and for this reason the light transmission thereof does not decrease even after 40,000 hours of operating time, even in the case of HB LEDs (High-Brightness LEDs), or of LEDs which emit light of short wavelength (from 380 to 450 nm) or white light. The compositions of the invention can be used for any of the LED designs that require chip masking.

The silicone resin compositions of the invention can be used not only in the application as potting compositions for the production of moldings but also by way of example for coatings and impregnation systems, or else as additives in other compositions. Since the modular system permits adjustment to very high, and also very low, viscosities, there are moreover possible uses as impregnation resin, e.g. for electrical insulation systems in motors, transformers, and cables, in a composite with other materials, e.g. glass textile, paper, glass-mica strips, etc.

The present text characterizes substances via provision of data obtained by means of instrumental analysis. The underlying measurements are either made in compliance with standards available to the public or determined by specifically developed methods. In order to ensure that the subject matter taught is clear, the methods used are stated here:

Viscosity:

Unless otherwise stated, viscosities are determined via measurement in a rotary viscometer in accordance with DIN EN ISO 3219. Unless otherwise stated, all of the viscosity data are valid at 25° C. and atmospheric pressure of 1013 mbar.

Refractive Index:

Refractive indices are determined in the wavelength region of visible light, unless otherwise stated at 589 nm at 25° C. and atmospheric pressure of 1013 mbar in accordance with the standard DIN 51423.

Transmittance:

Transmittance is determined via UV VIS spectroscopy. An example of suitable equipment is the Analytik Jena Specord 200. The measurement parameters used are—range: from 190 to 1100 nm, step width: 0.2 nm, integration time: 0.04 s, measurement mode: stepwise operation. The reference measurement is first made (background). A quartz plate secured to a sample holder (dimension of quartz plates: H×W about 6×7 cm, thickness about 2.3 mm) is placed in the sample beam path and measured against air.

The sample is then measured. A quartz plate secured on the sample holder and with applied sample—layer thickness of applied sample about 1 mm—is placed in the sample beam path and measured against air. The transmission spectrum of the sample is provided by internal calculation against background spectrum.

Molecular Compositions:

Molecular compositions are determined by means of nuclear resonance spectroscopy (for terminology see ASTM E386: High-resolution nuclear magnetic resonance spectroscopy (NMR): Terms and symbols), the measurements here being made on the $^1$H nucleus and on the $^{29}$Si nucleus.

Description—$^1$H NMR Measurement

Solvent: $CDCl_3$, 99.8% D

Sample concentration: about 50 mg/1 ml $CDCl_3$ in 5 mm NMR tube

Measurement without addition of TMS, spectra referenced by residual $CHCl_3$ in $CDCl_3$ to 7.24 ppm Spectrometer: Bruker Avance I 500 or Bruker Avance HD 500 Sample head: 5 mm BBO sample head or SMART sample head (Bruker)

Measurement Parameters:

Pulprog=zg30

TD=64 k

NS=64 and, respectively, 128 (depending on the sensitivity of the sample head)

SW=20.6 ppm

AQ=3.17 s

D1=5 s

SFO1=500.13 MHz

O1=6.175 ppm

Processing Parameters:

SI=32 k

WDW=EM

LB=0.3 Hz

Appropriate individual adjustments of the measurement parameters may be necessary, depending on the type of spectrometer used.

Description of $^{29}$Si NMR Measurement

Solvent: $C_6D_6$ 99.8% D/$CCl_4$ 1:1 v/v with 1% by weight of $Cr(acac)_3$ as relaxation reagent Sample concentration: about 2 g/1.5 ml of solvent in 10 mm NMR tube Spectrometer: Bruker Avance 300

Sample head: 10 mm 1H/13C/15N/29Si glass-free QNP sample head (Bruker)

Measurement Parameters:

Pulprog=zgig60

TD=64 k

NS=1024 (depending on the sensitivity of the sample head)

SW=200 ppm

AQ=2.75 s

D1=4 s

SFO1=300.13 MHz

O1=−50 ppm

Processing Parameters:

SI=64 k

WDW=EM

LB=0.3 Hz

Appropriate individual adjustments of the measurement parameters may be necessary, depending on the type of spectrometer used.

Molecular Weight Distributions:

Molecular weight distributions are determined as weight average Mw and as number average Mn, the method used being gel permeation chromatography (GPC or Size Exclusion Chromatographie (SEC)) with polystyrene standard and refractive index detector (RI detector). Unless otherwise stated, THF is used as the eluent and DIN 55672-1 is applied. The polydispersity is the quotient Mw/Mn.

Glass Transition Temperatures:

Glass transition temperature is determined by differential scanning calorimetry (DSC) in accordance with DIN 53765, perforated crucible, heating rate 10 K/min.

EXAMPLES

Examples are given below for the preparations of the invention and production thereof.

All percentage data are based on weight. Unless otherwise stated, all operations are executed at room temperature of about 23° C. and under atmospheric pressure (1.013 bar). The apparatuses are commercially available laboratory equipment such as that marketed by numerous equipment manufacturers.

Ph is a phenyl moiety =$C_6H_5$—.

Me is a methyl moiety =$CH_3$—.

$Me_2$ is correspondingly two methyl moieties.

An essential property of the preparations of the invention is that they have intracrosslinkable, branched polyorganosiloxane components. The syntheses of products of this type are described below:

Comparative Example 1: Not Inventive 16,116 g of water, 12,240 g of toluene, and 5436 g of ethyl acetate are weighed into a 60 l glass mixer, and mixed. A mixture of 1947.3 g of methyldichlorosilane $(CH_3)Si(H)Cl_2$ (115 g/mol=>input weight 16.93 mol), 7770 g of phenyltrichlorosilane $PhSiCl_3$ (211.5 g/mol=>input weight 36.74 mol), and 2061 g of vinyldimethylchlorsilane $(CH_2$=$CH)$ $Me_2SiCl$ (120.5 g/mol=>input weight 17.10 mol) are added uniformly to said initial charge over a period of 3 hours. The exothermic nature of the reaction leads to a temperature increase of no more than 47° C. Stirring is continued for 30 minutes, and the mixture is then allowed to settle for 30 minutes, without stirring in order that the phases can separate. 24 kg of aqueous phase comprising hydrochloric acid are then removed. 12 kg of deionized water are added to the organic phase, and the mixture is stirred for 30 minutes and then allowed to stand for 30 minutes without stirring, so that the phases can separate. The aqueous phase is removed, and the organic phase is again washed in the same way three times, with in each case 12 kg of deionized water. After the final wash, the organic phase is heated to 80° C., the apparatus being evacuated to an internal pressure of 150 mbar. All of the constituents volatile at 80° C. and the stated reduced pressure are distilled, and 8 kg of crude product are obtained; this product is then further distilled at 160° C. and a reduced pressure of 20 mbar, until there are no further residual constituents volatile under these conditions. This gives 6 kg of product. The viscosity of the resultant product is 5150 mPas at 25° C. and atmospheric pressure of 1013 mbar. $^1$H NMR gives the residual solvent content as: 0.06% by weight of toluene. Total chloride content is 8 mg/kg. The APHA color number is 14, and the Sigrist turbidity is 2.55 ppm. Values determined by Size Exclusion Chromatography (SEC) in THF as eluent are Mw=2600 g/mol and Mn=1500 g/mol. The $^{29}$Si NMR spectrum gives the following molar composition of the product:

$(CH_2=CH)Me_2SiO_{1/2}$: 21.6%
$Me(H)SiO_{2/2}$: 24.3%
$Ph(OR)_2SiO_{1/2}$: 0.4%
$Ph(OR)SiO_{2/2}$: 17.5%
$PhSiO_{3/2}$: 36.2% where R is mainly ethyl, or else hydrogen.

Silanol content can only be estimated approximately, because of signal overlapping, and is estimated from the $^1$H NMR spectrum to be approximately 6500 ppm. Content of vinyl groups from $^2$H NMR is 1.99 mmol/g, content of silicon-bonded hydrogen being 2.23 mmol/g.

Example 2: Inventive

The following are introduced, as an initial charge, into a 60 l glass mixer: 16,116 g of water, 12,240 g of toluene, 5436 g of ethyl acetate, and 3108 g of a short-chain alpha, omega silanol-functional phenylmethyl oil which has the average composition: HO—Si(Me) (Ph)[O—Si(Me) (Ph)]$_4$ OSi(Me)(Ph)OH, which therefore comprises a total of 6 repeating silicon units, each of which is substituted by a phenyl and a methyl group, the two terminal silicon atoms of which in each case bear a hydroxyl function, and which has an average molar mass of Mw=800 g/mol with Mn=700 g/mol, and a viscosity of 503 mPas at 25° C. and atmospheric pressure of 1013 mbar.

7770 g of phenyltrichlorosilane (211.5 g/mol=>input weight 36.7 mol), 1800 g of vinyldimethylchlorosilane (120.5 g/mol=>input weight 14.9 mol), and 1822.5 g of methyldichlorosilane (115 g/mol=>input weight 15.8 mol) are mixed with one another and metered within a period of 5 hours into the initial charge. The temperature rises from 25.7° C. to 48.7° C. After addition has ended, stirring is continued for 45 minutes, and the mixture is then heated to reflux for 1 hour (bottom temperature 83° C.), and the stirrer is then switched off. After 45 minutes of phase separation, the aqueous phase is removed.

For washing until neutral, 12 kg of deionized water are added to the organic phase, the mixture is stirred for 30 minutes, and the phases are allowed to separate for 30 minutes. The aqueous phase is removed. This wash procedure is carried out in the same way three times in total, until residual HCl content in the organic phase is 3 ppm.

The mixture is then distilled at atmospheric pressure until the temperature of the material in the mixer is 124° C., giving 9543 g of distillate and 14,125 g of undistilled residue. A sample weighing 1383.5 g is taken from the residue, and is distilled on a rotary evaporator at an oil-bath temperature of 160° C. and a reduced pressure of 20 mbar for 1 hour. This gives 962.1 g of a 69.6% by weight product solution, which is filtered while hot through a Seitz K 100 filter sheet with Seitz filter aid FF. The resultant filtrate is clear and colorless. Its Brookfield viscosity is 2870 mPas.

SEC (eluent THF) gives the molar mass of the product as Mw=2400 g/mol and Mn=1300 g/mol.

Silanol content is only approximate in $^1$H NMR because of signal overlapping, and is about 10,052 ppm. Vinyl content is 1.30 mmol/g, and content of silicon-bonded hydrogen is 1.44 mmol/g.

The molar composition from $^{29}$Si NMR is:
$(CH_2=CH)Me_2SiO_{1/2}$: 15.2%
$Me (H) SiO_{2/2}$: 15.4%
$Ph(Me)SiO_{2/2}$: 27.3% (also includes $Ph(Me)(RO)SiO_{2/2}$)
$Ph (OR)_2SiO_{2/2}$: 0.4%
$Ph(OR)SiO_{2/2}$: 15.5%
$PhSiO_{3/2}$: 26.2% where R here is mainly ethyl, or else is hydrogen.

Example 3: Inventive 135.0 g of methyldichlorosilane $(CH_3) Si(H)Cl_2$ (115 g/mol=>input weight 1.17 mol), 518.0 g of phenyltrichlorosilane $PhSiCl_3$ (211.5 g/mol=>input weight 2.45 mol), and 133.4 g of vinyldimethylchlorosilane $(CH_2=CH)Me_2SiCl$ (120.5 g/mol=>input weight 1.11 mol) are weighed together with 816 g of toluene into a 4 l 4-necked round-bottomed glass flask with outlet, and mixed. 185 g of ethanol are metered uniformly into this initial charge within a period of 40 minutes, and the temperature of the reaction mixture falls to 16° C. Stirring is continued for 15 minutes, and is followed by addition of 125.8 g of a short-chain alpha omega silanol-functional phenylmethyl oil which has the average composition: HO—Si(Me)(Ph)[O—Si(Me)(Ph)]$_4$ OSi(Me)(Ph)OH, which therefore comprises a total of 6 repeating silicon units, each of which is substituted by a phenyl and a methyl group, the two terminal silicon atoms of which in each case bear a hydroxyl function, and which has an average molar mass of Mw=800 g/mol with Mn=700 g/mol, and a viscosity of 503 mPas at 25° C. and atmospheric pressure of 1013 mbar.

250 g of deionized water are then metered into the mixture within a period of 2 hours. Initially, metering is very slow, in order to avoid excessive evolution of gaseous hydrogen chloride. The reaction that begins is exothermic, and is controlled via the water-addition procedure in such a way that the temperature rises as far as about 40° C. After water addition has ended, stirring is continued for 10 minutes at the temperature then prevailing, and the mixture is then heated to reflux (temperature in the reaction mixture about 83° C.). After two hours at reflux, without prior cooling, 176.4 g of toluene and 175 g of deionized water are added, stirring is continued for 10 minutes, and the stirrer is then switched off. The phases are allowed to separate within a period of 40 minutes, without stirring. The lower aqueous phase comprising hydrochloric acid is removed. 500 g of deionized water are then added, the mixture is stirred for 10 minutes, phases are allowed to separate for 45 minutes, without stirring, and again the aqueous phase is removed. The HCl content in the organic phase is less than 7 ppm. The organic phase is concentrated by evaporation in a rotary evaporator at 150° C. oil bath temperature and at a reduced pressure of 10 mbar for 30 minutes, and then the pressure is increased from 10 to 20 mbar, and the oil bath temperature is increased from 150° C. to 160° C. Distillation is continued for a further 3 hours, and a colorless liquid product is obtained with a viscosity of 2600 mPas.

SEC gives Mw=2600 and Mn=1200.

Silanol content can only be estimated, because of signal overlapping, and is about 10,030 ppm. Vinyl content is 0.95 mmol/g, and content of silicon-bonded hydrogen is 1.02 mmol/g. The molar composition from $^{29}$Si NMR is:
$(CH_2=CH)Me_2SiO_{1/2}$: 11.2%
$Me(H)SiO_{2/2}$: 12.0%
$Ph(Me)SiO_{2/2}$: 41.9% (also includes $Ph(Me)(RO)SiO_{1/2}$)
$Ph(OR)_2SiO_{1/2}$: 0.80
$Ph(OR)SiO_{2/2}$: 14.4%
$PhSiO_{3/2}$: 19.7%
where R is mainly ethyl, or else is hydrogen.

Example 4: Inventive 325.3 g of a phenylsilicone resin which is solid at 23° C. and atmospheric pressure of 1013 mbar, with an average molar mass Mw of 2900 g/mol (number average Mn=1500) and with a glass transition temperature of Tg=52° C., which comprises 5.5% by weight of silicon-bonded hydroxy groups and 3.3% by weight of silicon-bonded epoxy groups, and which is composed of 100 mol % of $PhSiO_{3/2}$ units, where the ethoxy groups and the hydroxy groups are distributed across the structural units stated, are weighed into 325.3 g of phenyltriethoxysilane $PhSi(EtO)_3$ (240 g/mol=>input weight 1.36 mol) in a 4 l 4-necked round-bottomed glass flask with outlet, and the mixture is stirred at 60° C. until the phenylsilicone resin has dissolved in the phenyltriethoxysilane.

Into this solution are introduced 260 g of a linear alpha omega silanol-functional phenylmethyl oil which has the average composition: $HO\text{—}Si(Me)(Ph)[O\text{—}Si(Me)(Ph)]_{14}OSi(Me)(Ph)OH$, which therefore comprises a total of 16 repeating silicon units, each of which is substituted by a phenyl and a methyl group, the two terminal silicon atoms of which in each case bear a hydroxyl function, and which has an average molar mass of Mw=2200 g/mol with Mn=1000 g/mol, and has a viscosity of 1103 mPas at 25° C. and atmospheric pressure of 1013 mbar. The following are added in succession to the resultant preparation: firstly 129 g of 1,3-divinyl-1,1,3,3-tetramethyldisiloxane $[(CH_2=CH)Me_2Si]_2O$ (186 g/mol=>input weight 0.69 mol), and then 321 g of water. 130.7 g of vinyldimethylchlorosilane $(CH_2=CH)Me_2SiCl$ (120.5 g/mol=>input weight 1.38 mol) are metered into the resultant preparation, with stirring. The metering time is 46 minutes, and during the metering process the heat of reaction causes the temperature to rise from 22.3° C. to 41° C., without any external heating. Once metering has ended, the mixture is heated to reflux (bottom temperature 85° C.) and kept at reflux for 30 minutes.

190 ml of distillate are then removed. The temperature of the material in the mixer rises to 92° C., and the overhead temperature rises to 84° C. The mixture is cooled to below 80° C., 533 ml of toluene are added, the mixture is mixed for 15 minutes, the stirrer is then switched off, and the water phase is removed after a waiting time, without stirring, of 30 minutes. At the juncture of phase separation, the temperature of the mixture is still 50° C., by virtue of slight external heating.

For washing of the organic phase, 540 ml of deionized water and 100 g of sodium chloride are added, the mixture is stirred for 15 minutes, and the stirrer is then switched off. After 30 minutes of phase separation without stirring, the phases are separated. The HCl content of the organic phase is 3 ppm. 200 ml of the solution are removed for the stability test. The mixture proves to be stable. This quantity is then ignored in the subsequent work-up.

420 ml of distillate are distilled from the organic phase, the material is cooled to below 60° C., and then the warm solution is filtered, with a pressure filter funnel, through a Seitz K 100 filter sheet with Seitz filter aid FF. The resultant 672.9 g of filtrate are clear and colorless. Solids content is determined as 87.9% by weight (by heating 1 g of substance for half an hour to 200° C. and determining the quantity of residue gravimetrically).

SEC (eluent THF) gives the molar mass of the product as Mw=2600 g/mol and Mn=1200 g/mol.

Silanol content is only approximate in $^1$H NMR because of signal overlapping, and is about 2200 ppm. Vinyl content is 1.17 mmol/g, and content of silicon-bonded hydrogen is 0.92 mmol/g.

The molar composition from $^{29}$Si NMR is:
$(CH_2=CH)Me_2SiO_{1/2}$: 14.8%
$Me_2(H)SiO_{1/2}$: 11.7%
$Ph(Me)SiO_{2/2}$: 27.2% (also includes $Ph(Me)(RO)SiO_{1/2}$)
$Ph(OR)_2SiO_{1/2}$: 1.6%
$Ph(OR)SiO_{2/2}$: 18.2%
$PhSiO_{3/2}$: 26.5%
where R is mainly ethyl, or else is hydrogen.

Example 5: Inventive

The procedure is as in example 4, except that instead of the linear phenylmethylpolysiloxane having an average of 16 repeat units a short-chain alpha omega silanol-functional phenylmethyl oil is used which has the average composition: $HO\text{—}Si(Me)(Ph)[O\text{—}Si(Me)(Ph)]_4OSi(Me)(Ph)OH$, which therefore comprises a total of 6 repeating silicon units, each of which is substituted by a phenyl and a methyl group, the two terminal silicon atoms of which in each case bear a hydroxyl function and which has an average molar mass of Mw=800 g/mol with Mn=700 g/mol, and has a viscosity of 503 mPas at 25° C. and atmospheric pressure of 1013 mbar.

This gives 952 g of a clear colorless product.

Solids content is determined as 89.2% by weight (by heating 1 g of substance for half an hour to 200° C. and determining the quantity of residue gravimetrically).

SEC (eluent THF) gives the molar mass of the product as Mw=1800 g/mol and Mn=1100 g/mol.

Silanol content is only approximate in $^1$H NMR because of signal overlapping, and is about 10,100 ppm. Vinyl content is 1.30 mmol/g, and content of silicon-bonded hydrogen is 1.14 mmol/g.

The molar composition from $^{29}$Si NMR is:
$(CH_2=CH)Me_2SiO_{1/2}$: 15.5%
$Me_2(H)SiO_{1/2}$: 13.4%
$Ph(Me)SiO_{2/2}$: 25.1% (also includes $Ph(Me)(RO)SiO_{1/2}$)
$Ph(OR)_2SiO_{1/2}$: 1.0%
$Ph(OR)SiO_{2/2}$: 15.5%
$PhSiO_{3/2}$: 29.5%
where R is mainly ethyl, or else is hydrogen.

Preparation Examples

Examples of preparations of the invention are listed below for purposes of illustration, but certainly not for purposes of restriction. Unless otherwise stated, all data concerning parts or percentages in these examples are based on weight. All data concerning refractive indices are moreover based on a temperature of 25° C. Transmittance was determined as disclosed at an earlier stage above. The solids content of the resin solutions in toluene was calculated by means of the $^1$H NMR spectrum. Shore hardness values A and D were determined in accordance with DIN 53505-A-87. Ultimate tensile strength values were measured in accordance with DIN 53504-85/standard specimen S1, and tear strength values were determined in accordance with ASTM D624 B-91.

Preparation Example (Comparative Example) 1: Preparation with Resin in Accordance with Comparative Example 1: Not Inventive 90.0 g of the resin described in comparative example 1, 10.0 g of a linear siloxane copolymer which according to $^{29}$Si NMR spectrum has an average of 60 phenylmethylsiloxane units, 12 dimethylsiloxane units, and 2 dimethylvinylsiloxane terminal groups, and also 0.025 g of an 80% solution of 1-ethynylcyclohexanol in trimethylsilanol, and 0.0025 g of a platinum(0) sym. tetramethyldivinyldisiloxane complex (Karstedt catalyst) with 20% by weight content of platinum, calculated as elemental metal, are mixed homogeneously. The refractive index of the preparation was 1.5175.

The resultant mixture is poured into a Teflon-coated stainless steel mold of depth 2 mm with a cavity of depth 6 mm, and the closed stainless steel mold is initially subjected to incipient vulcanization for 15 minutes at 165° C. and at a pressure of 5.45 MPa in a laboratory press for shaping. The remainder of the hardening process then takes place at atmospheric pressure for 6 hours at 150° C. in a convection drying oven.

After a conditioning time of 16 hours, mechanical properties were determined. The vulcanizate was very brittle. The Shore D hardness of the test sample, thickness 6 mm, was 70, and the following properties were measured on the foil, thickness 2 mm: ultimate tensile strength 7.8 N/mm$^2$, tensile strain at break 3%, and tear strength 15.2 N/mm. Transmittance at 550 nm was 90.9%.

Preparation Example 2: Preparation with Resin in Accordance with Example 2: Inventive 60.0 g of the liquid resin described in example 2 and 40.0 g of a linear siloxane copolymer which according to $^{29}$Si NMR spectrum has an average of 60 phenylmethylsiloxane units, 12 dimethylsiloxane units, and 2 dimethylvinylsiloxane terminal groups, and also 0.025 g of an 80% solution of 1-ethynylcyclohexanol in trimethylsilanol, and 0.0025 g of a platinum(0) sym. tetramethyldivinyldisiloxane complex (Karstedt catalyst) with 20% by weight content of platinum, calculated as elemental metal, are mixed homogeneously. The refractive index of the preparation was 1.5325.

The resultant mixture is poured into a Teflon-coated stainless steel mold of depth 2 mm with a cavity of depth 6 mm, and the closed stainless steel mold is initially subjected to incipient vulcanization for 15 minutes at 165° C. and at a pressure of 5.45 MPa in a laboratory press for shaping. The remainder of the hardening process then takes place at atmospheric pressure for 6 hours at 150° C. in a convection drying oven.

After a conditioning time of 16 hours at room temperature the Shore D hardness of the test sample, thickness 6 mm, was 12, and the following properties were measured on the foil, thickness 2 mm: ultimate tensile strength 1.3 N/mm$^2$, tensile strain at break 22%, and tear strength 3.4 N/mm. Transmittance at 550 nm was 96.2%.

Preparation Example 3: Preparation with Resin in Accordance with Example 3: Inventive 60.0 g of the liquid resin described in example 3 and 40.0 g of a linear siloxane copolymer which according to $^{29}$Si NMR spectrum has an average of 60 phenylmethylsiloxane units, 12 dimethylsiloxane units, and 2 dimethylvinylsiloxane terminal groups, and also 0.025 g of an 80% solution of 1-ethynylcyclohexanol in trimethylsilanol, and 0.0025 g of a platinum(0) sym. tetramethyldivinyldisiloxane complex (Karstedt catalyst) with 20% by weight content of platinum, calculated as elemental metal, are mixed homogeneously. The refractive index of the preparation was 1.5335.

The resultant mixture is poured into a Teflon-coated stainless steel mold of depth 2 mm with a cavity of depth 6 mm, and the closed stainless steel mold is initially subjected to incipient vulcanization for 15 minutes at 165° C. and at a pressure of 5.45 MPa in a laboratory press for shaping. The remainder of the hardening process then takes place at atmospheric pressure for 6 hours at 150° C. in a convection drying oven.

After a conditioning time of 16 hours at room temperature the Shore D hardness of the test sample, thickness 6 mm, was 14, and the following properties were measured on the foil, thickness 2 mm: ultimate tensile strength 1.2 N/mm$^2$, tensile strain at break 29%, and tear strength 3.0 N/mm. Transmittance at 550 nm was 97.1%.

Preparation Example 4: Preparation with Resin in Accordance with Example 4: Inventive 65.4 g (solids content: 60 g) of a 91.7% toluene solution of the resin described in example 4, 40.0 g of a linear siloxane copolymer which according to $^{29}$Si NMR spectrum has an average of 60 phenylmethylsiloxane units, 12 dimethylsiloxane units, and 2 dimethylvinylsiloxane terminal groups, and 2.2 g of 1,4-bis(dimethylsilyl)benzene, and also 0.026 g of an 80% solution of 1-ethynylcyclohexanol in trimethylsilanol, and 0.0026 g of a platinum(0) sym. tetramethyldivinyldisiloxane complex (Karstedt catalyst) with 20% by weight content of platinum, calculated as elemental metal, are mixed homogeneously. The refractive index of the preparation was 1.5289.

The resultant mixture is poured into a Teflon-coated stainless steel mold of depth 2 mm with a cavity of depth 6 mm, and the closed stainless steel mold is initially subjected to incipient vulcanization for 15 minutes at 165° C. and at a pressure of 5.45 MPa in a laboratory press for shaping. The remainder of the hardening process then takes place at atmospheric pressure for 6 hours at 150° C. in a convection drying oven.

After a conditioning time of 16 hours at room temperature the Shore D hardness of the test sample, thickness 6 mm, was 18, and the following properties were measured on the foil, thickness 2 mm: ultimate tensile strength 1.3 N/mm$^2$, tensile strain at break 47%, and tear strength 2.8 N/mm. Transmittance at 550 nm was 98.2%.

Preparation Example 5: Preparation with Resin in Accordance with Example 5: Inventive 65.9 g (solids content: 60 g) of a 91.0% toluene solution of the resin described in example 5, 40.0 g of a linear siloxane copolymer which according to $^{29}$Si NMR spectrum has an average of 60 phenylmethylsiloxane units, 12 dimethylsiloxane units, and 2 dimethylvinylsiloxane terminal groups, and 2.0 g of 1,4-bis(dimethylsilyl)benzene, and also 0.026 g of an 80% solution of 1-ethynylcyclohexanol in trimethylsilanol, and 0.0026 g of a platinum(0) sym. tetramethyldivinyldisiloxane complex (Karstedt catalyst) with 20% by weight content of platinum, calculated as elemental metal, are mixed homogeneously. The refractive index of the preparation was 1.5280.

The resultant mixture is poured into a Teflon-coated stainless steel mold of depth 2 mm with a cavity of depth 6 mm, and the closed stainless steel mold is initially subjected to incipient vulcanization for 15 minutes at 165° C. and at a pressure of 5.45 MPa in a laboratory press for shaping. The remainder of the hardening process then takes place at atmospheric pressure for 6 hours at 150° C. in a convection drying oven.

After a conditioning time of 16 hours at room temperature the Shore D hardness of the test sample, thickness 6 mm, was 15, and the following properties were measured on the foil, thickness 2 mm: ultimate tensile strength 1.2 N/mm², tensile strain at break 46%, and tear strength 2.5 N/mm. Transmittance at 550 nm was 97.8%.

What is claimed is:

1. An addition-crosslinking silicone resin composition comprising
   A) at least one branched, self-crosslinking organopolysiloxane of the formula (I)

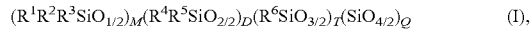

where
R¹ to R⁶ are mutually independently monovalent, optionally substituted hydrocarbon moieties which are optionally interrupted by heteroatoms, or are an OH group, or a hydrogen atom,
M, D, T, and Q are a number from 0 to <1,
with the proviso that M+D+T+Q=1 and Q+T>0, and
with the proviso that a molecule A) comprises, as moieties R¹ to R⁶,
at least two alkenyl groups,
at least two hydrogen atoms, and
at least one aryl group,
and with the provisos that at least 5 mol % of all of the subunits of A) are of the form $(R^4R^5SiO_{2/2})_D$, at least 6 mol % of all of the subunits $(R^4R^5SiO_{2/2})_D$ are present as chain segments made of from 3 to 200 adjacent subunits in A), and the moieties R⁴ and R⁵ of said subunits present as chain segments are neither a hydrogen atom nor an alkenyl moiety, where the molar ratio of the silicon-bonded repeating units bearing alkenyl groups to the repeating units bearing silicon-bonded hydrogen atoms is at least 0.75; and
where the molar proportion of the silicon atoms bearing at least one aryl moiety to the total number of the silicon atoms is at least 30%; and
where the molar proportion of the alkyl groups, based on the total number of the silicon-bonded moieties is at most 70%,
C) an effective catalyzing amount of at least one catalyst that promotes the addition reaction of Si-bonded hydrogen onto aliphatic double bonds,
where the molar ratio of silicon-bonded alkenyl groups to silicon-bonded hydrogen atoms in the addition-crosslinking silicone resin composition is from at least 0.75:1 to 2:1, and further comprising at least one flexipolymer D) of the formula (IV)

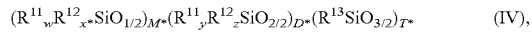

where
R¹¹ and R¹² and R¹³ are mutually independently optionally substituted hydrocarbon moieties which are optionally interrupted by heteroatoms, and are not a hydrogen atom;
w and x* are respectively a number 0, 1, 2, or 3, where w+x*=3;
y and z are respectively a number 0, 1, 2, or 3, where y+z=2;
M*, D*, and T* are a number from 0 to <1, where M*+D*+T*=1,
with the proviso that, per molecule D),
there are at least two alkenyl groups present as R¹¹, and
there is at least one aryl group present as R¹² or R¹³.

2. A process for the production of an addition-crosslinking silicone resin composition of claim 1, comprising mixing components A), C), and D).

3. A potting composition in electrical and electronic applications, comprising an addition crosslinking silicone resin of claim 1.

4. An LED component comprising a potting composition of an addition-crosslinking silicone resin composition of claim 1.

5. An addition-crosslinking silicone resin composition comprising
   A) at least one branched, self-crosslinking organopolysiloxane of the formula (I)

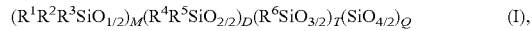

where
R¹ to R⁶ are mutually independently monovalent, optionally substituted hydrocarbon moieties which are optionally interrupted by heteroatoms, or are an OH group, or a hydrogen atom,
M, D, T, and Q are a number from 0 to <1,
with the proviso that M+D+T+Q=1 and Q+T>0, and
with the proviso that a molecule A) comprises, as moieties R¹ to R⁶,
at least two alkenyl groups,
at least two hydrogen atoms, and
at least one aryl group,
and with the provisos that at least 5 mol % of all of the subunits of A) are of the form $(R^4R^5SiO_{2/2})_D$, at least 6 mol % of all of the subunits $(R^4R^5SiO_{2/2})D$ are present as chain segments made of from 3 to 200 adjacent subunits in A), and the moieties R⁴ and R⁵ of said subunits present as chain segments are neither a hydrogen atom nor an alkenyl moiety, where the molar ratio of the silicon-bonded repeating units bearing alkenyl groups to the repeating units bearing silicon-bonded hydrogen atoms is at least 0.75; and
where the molar proportion of the silicon atoms bearing at least one aryl moiety to the total number of the silicon atoms is at least 30%; and
where the molar proportion of the alkyl groups, based on the total number of the silicon-bonded moieties is at most 70%,
C) an effective catalyzing amount of at least one catalyst that promotes the addition reaction of Si-bonded hydrogen onto aliphatic double bonds,
where the molar ratio of silicon-bonded alkenyl groups to silicon-bonded hydrogen atoms in the addition-crosslinking silicone resin composition is from 0.5:1 to 2:1, and further comprising:
   B) at least one Si—H functional coupling agent having at least two Si—H bonds per molecule, having one of the formulae:
      a) organohydrosilanes of the formula (II)

where $R^7$ and $R^9$ are mutually independently monovalent, optionally substituted hydrocarbon moieties which are optionally interrupted by heteroatoms, where $R^7$ and $R^9$ are not an alkenyl group, are not an OH group, and are not a hydrogen atom, H is a hydrogen atom, $R^8$ is a $C_1$ to $C_{36}$ hydrocarbylene group which is optionally interrupted by heteroatoms, and moieties $R^8$ are bonded by a carbon-silicon bond to the silicon atoms, or to an oxygen atom, g and j are 0, 1, 2, or 3, h and i are 1, 2, or 3, and there is always compliance with the following conditions: g+h=3 and i+j=3, b) organohydrosiloxanes of the formula (III)

$$[R^{10}{}_k(H)_l SiO_{1/2}]_4 Si \qquad (III)$$

where $R^{10}$ are mutually independently, monovalent, optionally substituted hydrocarbon moieties which are optionally interrupted by heteroatoms, where $R^{10}$ is not an alkenyl group, is not an OH group, and is not a hydrogen atom, H is a hydrogen atom, k and l are 0, 1, 2, or 3, and there is compliance with the following condition: k+l=3, c) polyorganohydrosiloxanes made of repeating units of the formula (V)

$$H_d R^7{}_e Si(OR^9)_f O_{(4-d-e-f)/2} \qquad (V),$$

where

H is a hydrogen atom, $R^7$ and $R^9$ are as defined above, and f is 0 and 1, where f is 1 in at most 10% of the units of the formula (V) and otherwise has the value 0, d+e is always >0, and in at least 2 units of the formula (V) has the value 3, and c) is composed of at least 3 repeating units of the formula (V), at least 10 mol % of c) repeating units comprise a silicon-bonded hydrogen atom.

6. The addition-crosslinking silicone resin of claim 5, wherein in at least 2 units of the formula (v), d=1 and e=2.

7. The addition-crosslinking silicone resin of claim 5, wherein in at least 2 units of the formula (V), d=1 and e=2 and wherein all other units of the formula (V), d=0 and e=2.

8. A process for the production of an addition-crosslinking silicone resin composition of claim 5, comprising mixing components A), B), and C).

9. A potting composition in electrical and electronic applications, comprising an addition crosslinking silicone resin of claim 5.

10. An LED component comprising a potting composition of an addition-crosslinking silicone resin composition of claim 5.

* * * * *